(12) United States Patent
Bai et al.

(10) Patent No.: US 10,855,283 B2
(45) Date of Patent: Dec. 1, 2020

(54) ROUTING NETWORK FOR RECONFIGURABLE CIRCUIT

(71) Applicant: NEC Corporation, Tokyo (JP)

(72) Inventors: Xu Bai, Tokyo (JP); Toshitsugu Sakamoto, Tokyo (JP); Yukihide Tsuji, Tokyo (JP); Makoto Miyamura, Tokyo (JP); Ayuka Tada, Tokyo (JP); Ryusuke Nebashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/621,770

(22) PCT Filed: Aug. 10, 2017

(86) PCT No.: PCT/JP2017/029108
§ 371 (c)(1),
(2) Date: Dec. 12, 2019

(87) PCT Pub. No.: WO2019/030899
PCT Pub. Date: Feb. 14, 2019

(65) Prior Publication Data
US 2020/0145007 A1 May 7, 2020

(51) Int. Cl.
*H03K 19/17736* (2020.01)
*H03K 19/173* (2006.01)
*H03K 19/17728* (2020.01)

(52) U.S. Cl.
CPC ... *H03K 19/17736* (2013.01); *H03K 19/1736* (2013.01); *H03K 19/1737* (2013.01); *H03K 19/17728* (2013.01)

(58) Field of Classification Search
None
See application file for complete search history.

(56) References Cited

U.S. PATENT DOCUMENTS

| 5,581,199 A | 12/1996 | Pierce et al. |
| 5,594,363 A | 1/1997 | Freeman et al. |
| 2015/0333756 A1* | 11/2015 | Wang .................. G06F 1/08 326/41 |
| 2016/0276025 A1* | 9/2016 | Tatsumura ......... G11C 13/0028 |
| 2017/0141125 A1 | 5/2017 | Tada |
| 2019/0052273 A1 | 2/2019 | Tada et al. |

FOREIGN PATENT DOCUMENTS

| WO | 2015/198573 A1 | 12/2015 |
| WO | 2017/038095 A1 | 3/2017 |

OTHER PUBLICATIONS

International Search Report for PCT Application No. PCT/JP2017/029108, dated Oct. 31, 2017.
Makoto Miyamura, et al., Low-power Programmable-logic Cell Arrays using Nonvolatile Complementary Atom Switch, ISQED 2014, pp. 330-334, Japan.

* cited by examiner

*Primary Examiner* — Jany Richardson

(57) ABSTRACT

A reconfigurable circuit comprising: crossbar switches; wires, each of which is coupled to one output port of one crossbar switch and input ports of the other crossbar switches; at least one inverter inserted on each wire for driving long-distance signal transfer, wherein one or less first inverter is inserted on the wire between two adjacent crossbar switches; one or two second inverters inserted between a crossbar switch input port and its connected wire.

10 Claims, 6 Drawing Sheets

M00~M11: memory (a)　　　　　　　(b)

ROUTING NETWORK FOR RECONFIGURABLE CIRCUIT

This application is a National Stage Entry of PCT/JP2017/029108 filed on Aug. 10, 2017, the contents of all of which are incorporated herein by reference, in their entirety.

TECHNICAL FIELD

The present invention relates to a reconfigurable circuit.

BACKGROUND ART

A typical semiconductor integrated circuit (IC) is constructed by transistors build on a semiconductor substrate and upper layer wires used to connect the transistors. The patterns of transistors and wires are determined in a design stage of the IC. Interconnections between the transistors and wires cannot be changed after fabrication. In order to improve flexibility of IC, field-programmable gate arrays (FPGAs) have been proposed and developed. In FPGAs, configuration data including operation and interconnection information is stored in the memories, so that different logic operations and interconnections can be realized by configuring memories after fabrication according to requirements of end users. Interconnections within FPGA can be altered by controlling ON-and-OFF of switches in a routing multiplexer (MUX) or routing fabrics arranged in the FPGA in accordance with the interconnection information stored in the memories.

The relatively large energy consumption of FPGAs limits integration of commercial FPGAs into IoT (Internet of Things) devices. In most of commercial FPGAs, SRAM (Static Random Access Memory) is used to store the configuration data. Typically, each memory cell of SRAM is composed of six transistors and each modern FPGA chip has more than 10M (ten-million) memory cells of SRAM. This causes extremely large area overhead, cost, and energy consumption in FPGAs. Recently, FPGAs with non-volatile resistive switches (NVRSs) such as Nanobridge(R) (NB) integrated between the wires upon a transistor layer have been proposed to overcome the speed and energy issues of SRAM-based FPGAs and achieve small area overhead [PTL 1, NPL 1].

CITATION LIST

Patent Literature

WO 2015/198573 A1

Non Patent Literature

Makoto Miyamura, et al., Low-power programmable-logic cell arrays using nonvolatile complementary atom switch, ISQED 2014, pp. 330-334.

SUMMARY OF INVENTION

Technical Problem

In FPGAs, buffers are necessary for speeding up long-distance data transfer. However, huge number of the buffers causes large power consumption and large area overhead.

Solution to Problem

A reconfigurable circuit comprising: crossbar switches; wires, each of which is coupled to one output port of one crossbar switch and input ports of the other crossbar switches; at least one inverter inserted on each wire for driving long-distance signal transfer, wherein one or less first inverter is inserted on the wire between two adjacent crossbar switches; one or two second inverters inserted between a crossbar switch input port and its connected wire.

DESCRIPTION OF EMBODIMENTS

Exemplary embodiment of the present invention will be next described with reference to the accompanying drawings.

First Exemplary Embodiment

Figure 1:
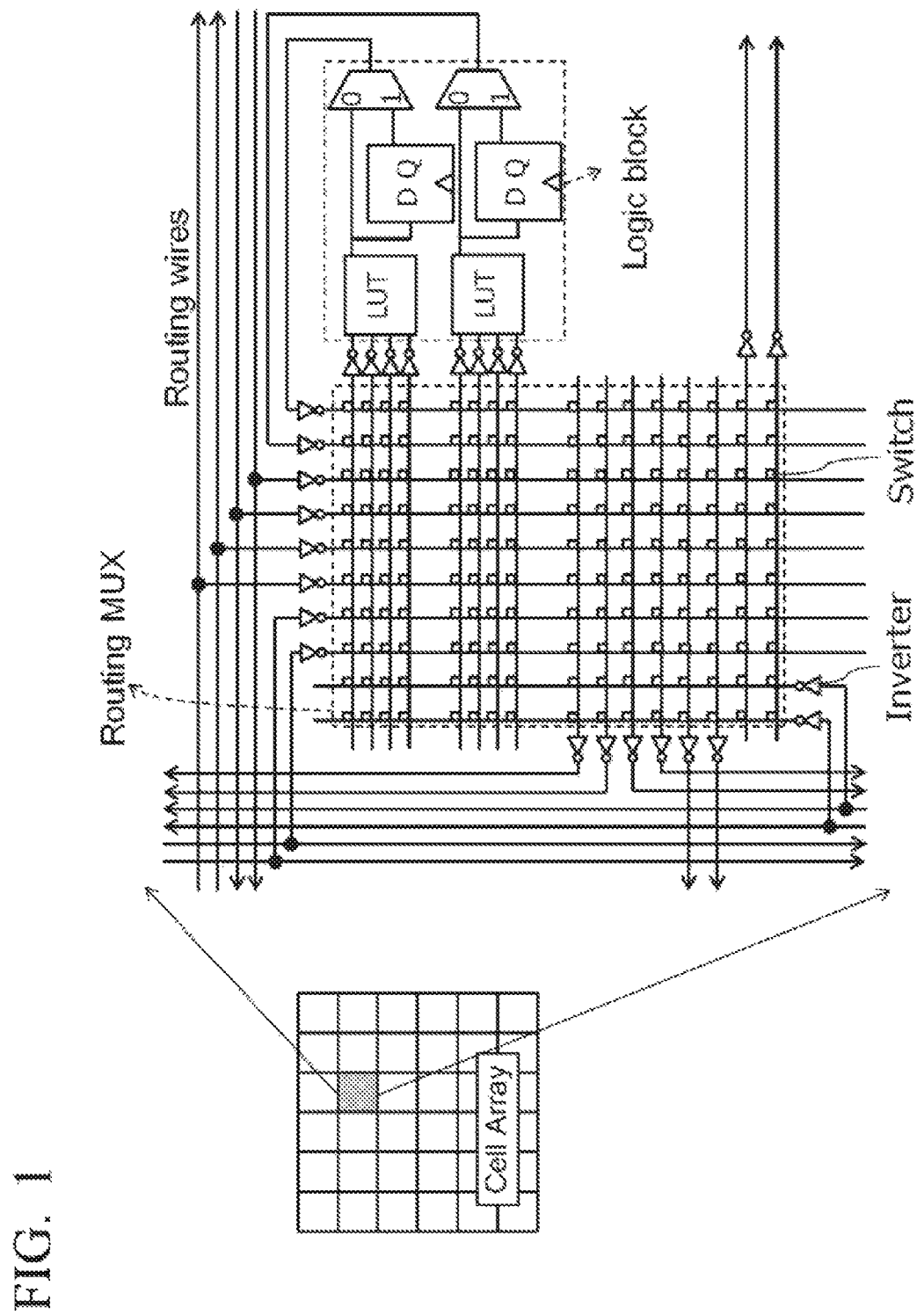
FIG. 1 is a schematic view illustrating an exemplary structure of the FPGA using the NVRSs.

FIG. 1 illustrates a typical structure of the FPGA using the NVRSs. A large number of cells constitute a cell array. Each cell consists of a routing MUX and a logic block. In this example, logic block includes two lookup tables (LUTs), two D-type flip-flops and two selectors. The routing MUX includes a plurality of input and output lines arranged in a lattice manner which are connected to logic block and adjacent cells. Data routing switch is arranged at each cross-point or intersection between the vertical lines and the horizontal lines. Therefore, routing MUX has a crossbar structure. Inverters connected to input and output lines drive data signal transfer within routing MUX and to the next cells, respectively.

Figure 2:
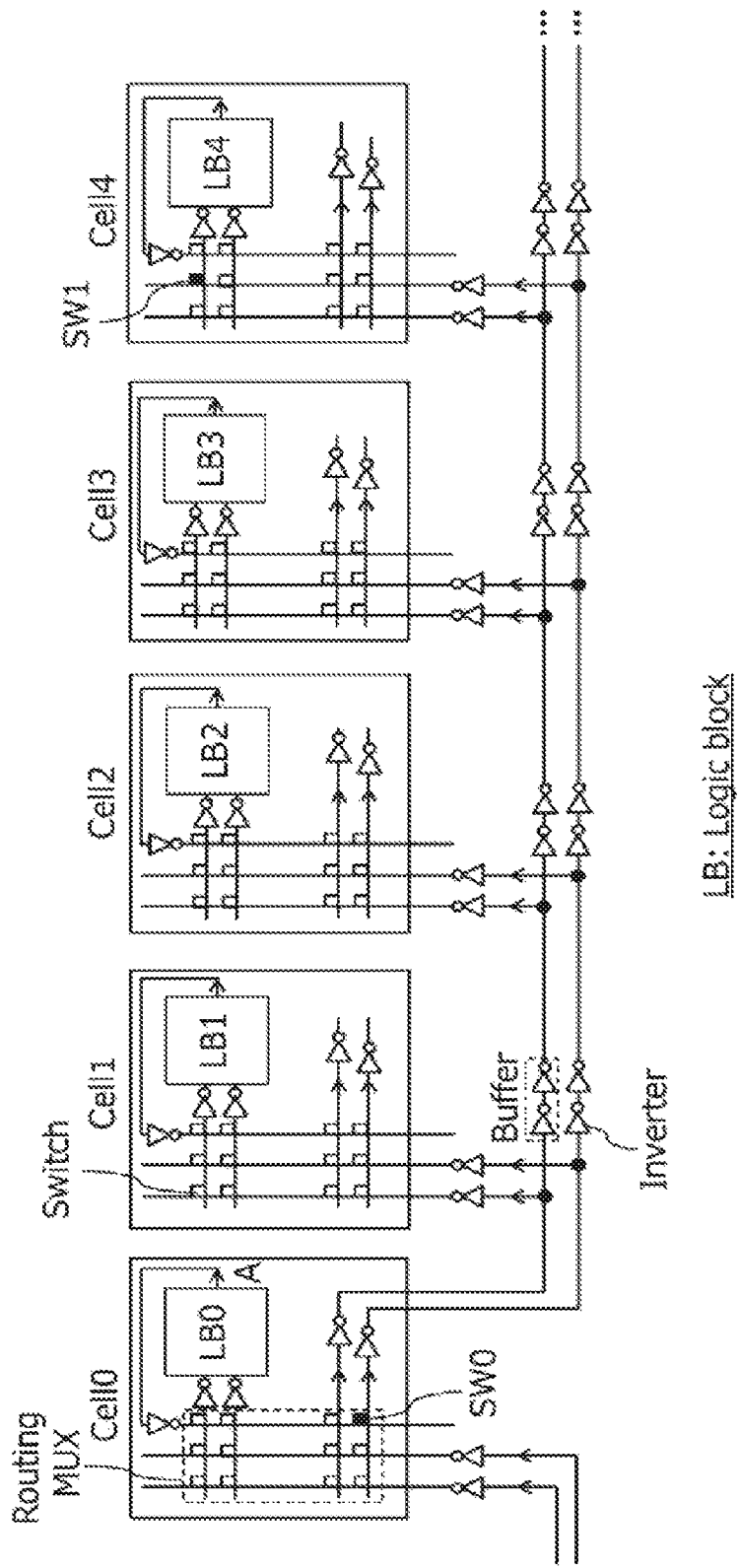
FIG. 2 shows a long-distance routing circuit using buffers according to a first exemplary embodiment of the present invention.

FIG. 2 illustrates a conventional long-distance routing circuit using buffers. In FPGAs, long wires connect cells with each other for long-distance data transfer. As shown in FIG. 2, Cell0 sends data signals to the other cells Cell1-Cell4 by long wires. Buffers are inserted on the long wire between two adjacent cells to speed up data signal transfer because of large wire resistance and capacitance. Each buffer is conventionally constructed by two inverters. For example, to transfer a data A from logic block LB0 in Cell0 to LB4 in Cell4, SW0 in Cell0 and SW1 in Cell4 are set as ON, six inverters are required on the long wire. Therefore, to connect one cell to next n cells, 2n-2 inverters are required on the long wire, which causes large power consumption and area.

Figure 3:
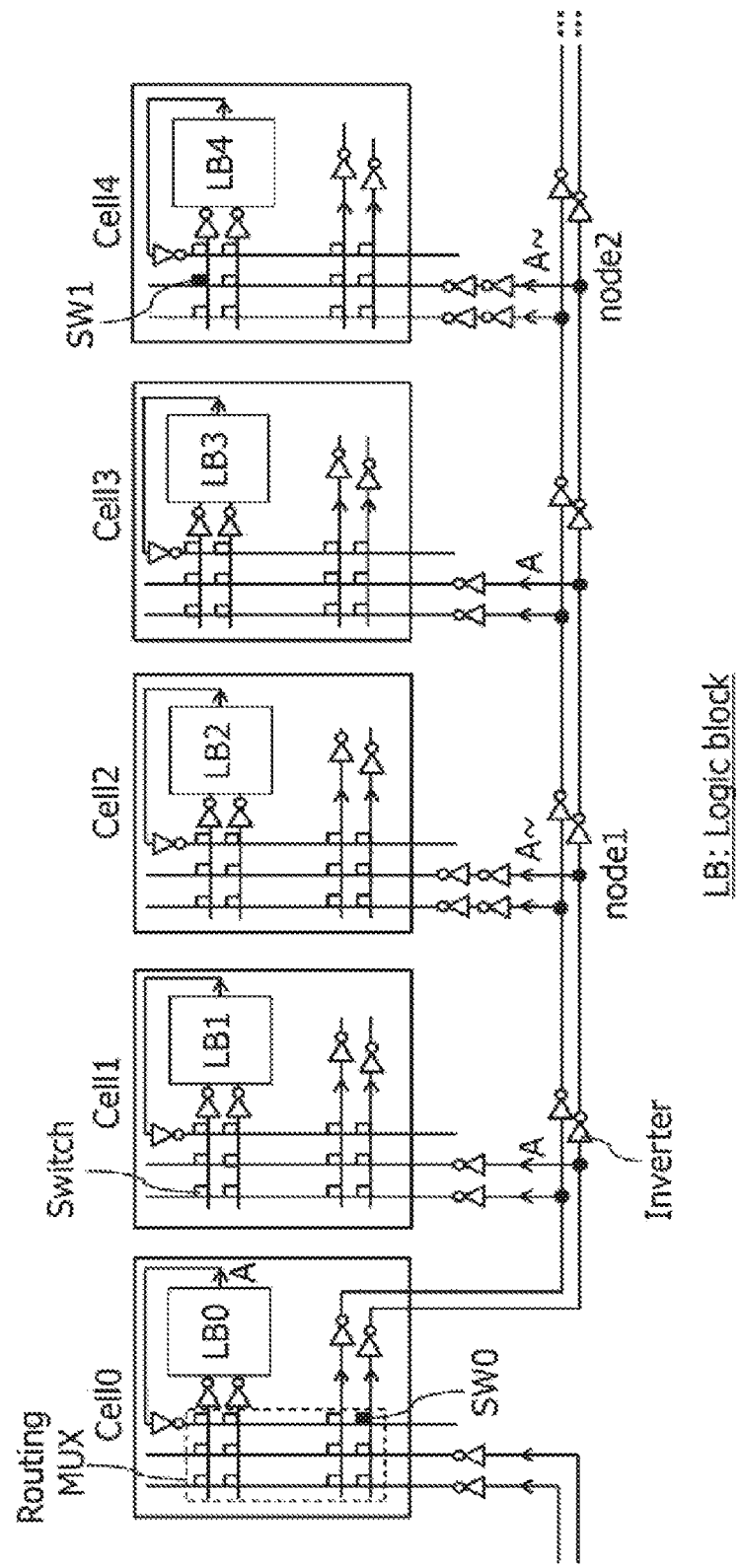
FIG. 3 illustrates a long-distance routing circuit using inverters according to a first exemplary embodiment of the present invention.

FIG. 3 illustrates a long-distance routing circuit using inverters according to the present embodiment. Instead of using buffers, inverters are inserted on the long wire to speed up data signal transfer. However, there is a signal inverse problem by using inverters. For example, to transfer a data A from logic block LB0 in Cell0 to LB4 in Cell4, SW0 in Cell0 and SW1 in Cell4 are set as ON, the signals at the node1 and node2 become an inverse signal A~. An additional inverter is inserted in each input of the Cell2 and Cell4 to solve signal inverse problem.

As a result, totally five inverters are required on the long wire. In case that to connect one cell to next n cells, 1.5n-1.5 inverters are required on the long wire if n is odd, while 1.5n-1 inverters are required on the long wire if n is even. In comparison with the conventional long-distance routing circuit using buffers shown in FIG. 2, the inverter number on the long wire in long-distance routing circuit using inverters according to the present embodiment is reduced for long-distance data transfer (large n). For example, if n=16, inverter number can be reduced by 23%. All the delay, area and power consumption can be reduced.

Second Exemplary Embodiment

Next, a second exemplary embodiment will be described. The present embodiment discloses a long-distance routing circuit using inverters without inserting inverters for signal inverse. Inverter number on the long wire is further reduced in comparison with that in the first exemplary embodiment.

Figure 4:
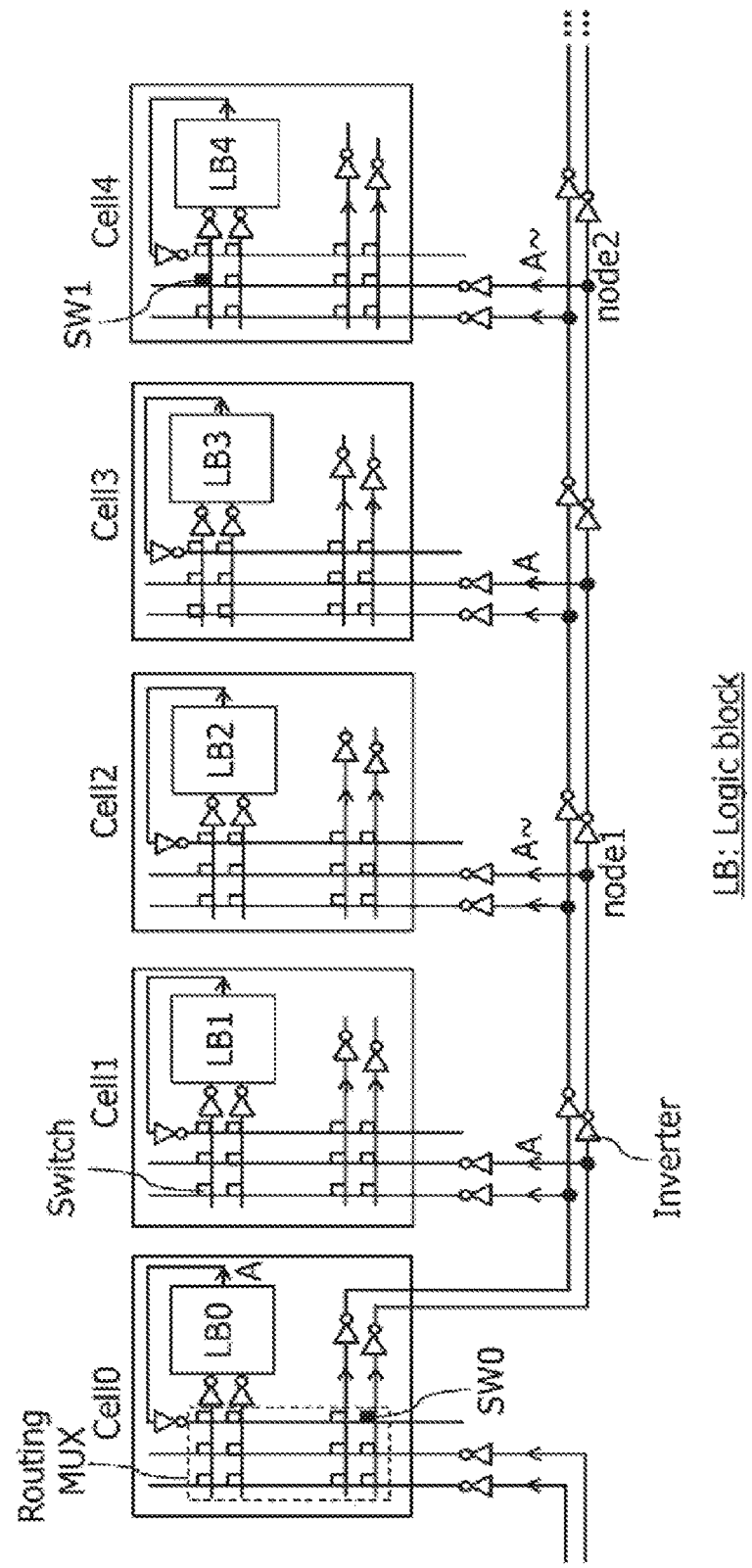
FIG. 4 illustrates a long-distance routing circuit using inverters according to a second exemplary embodiment of the present invention.

FIG. 4 illustrates a long-distance routing circuit using inverters according to the present embodiment. The same to the first embodiment, inverters are inserted on the long wire to speed up data signal transfer in the present embodiment. Therefore, there still is a signal inverse problem by using inverters. The difference from the first embodiment is that the solution to solve signal inverse problem is not to insert additional inverters in the inputs of the even cells, but to adjust the functions in logic blocks. Inverter number can be reduced half in comparison with the conventional long-distance routing circuit using buffers shown in FIG. 2 without inserting addition inverters for signal inverse.

Figure 5:
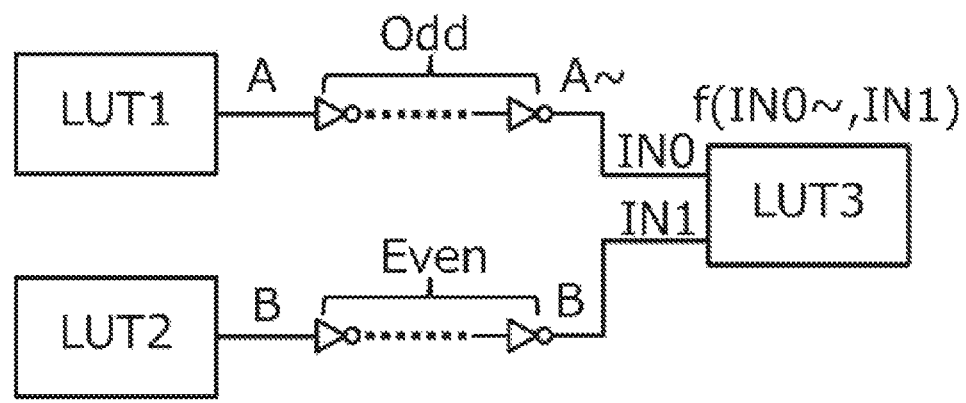
FIG. 5 illustrates configuration method of reconfigurable circuit according to a second exemplary embodiment of the present invention.
Figure 6:
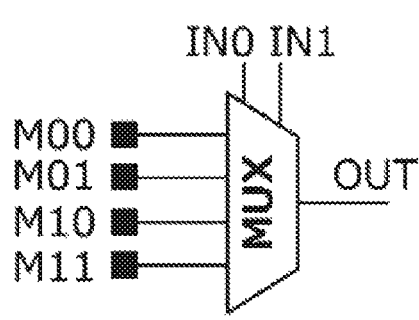
FIG. 6 illustrates an example of reconfigurable circuit configuration according to a second exemplary embodiment of the present invention.
Figure 6:
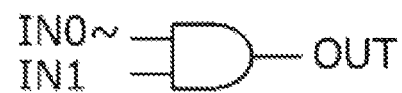

FIG. 5 illustrates configuration method to solve signal inverse problem according to the present embodiment. LUTs (LUT1 and LUT2) send data signals A and B, respectively, to LUT3 to implement a function f(A,B). It is assumed that there are odd number of inverters on the path between the LUT1 and LUT3, while even number of inverters on the path between the LUT2 and LUT3. The signals arriving at the LUT3 inputs ports IN0 and IN1 become A~ and B, respectively. The LUT3 is configured to implement f(IN0~, IN1) for f(A,B) generation to solve the signal inverse problem caused by odd number of inverters between LUT1 and LUT3. As an example, if AND function of A and B should be implemented in LUT3, it is necessary to configure LUT3 to implement AND function of IN0~ and IN1. FIG. 6 will show how to configure LUT3 to implement AND function of IN0~ and IN1.

FIG. 6 illustrates an example of configuration method to solve signal inverse problem according to the present embodiment. The LUTs implement arithmetic logic functions. FIG. 6 (a) shows a 2-input LUT constructed by two input ports IN0 and IN1, one multiplexer (MUX), four memories M00~M11, and one output port OUT. IN0 and IN1 select one of M00~M11 values as an output. For the (IN0,IN1) values (0,0), (0,1), (1,0) and (1,1), M00, M01, M10 and M11 are selected as the LUT output, respectively. M00~M11 can be configured as value "0" or "1" to implement an arbitrary function for IN0 and IN1. FIG. 6 (b) shows the values of M00~M11 to implement AND function of IN0~ and IN1. For (IN0,IN1)=(0,0), (1,0), (1,1), IN0~ AND IN1=0. On the other hand, for (IN0,IN1)=(0,1), IN0~ AND IN1=1. Therefore, M00, M01, M10 and M11 are configured as "0", "1", "0" and "0", respectively, to implement AND function of IN0~ and IN1. Signal reverse problem can be solved by adjusting configuration of LUT memories.

Figure 7:
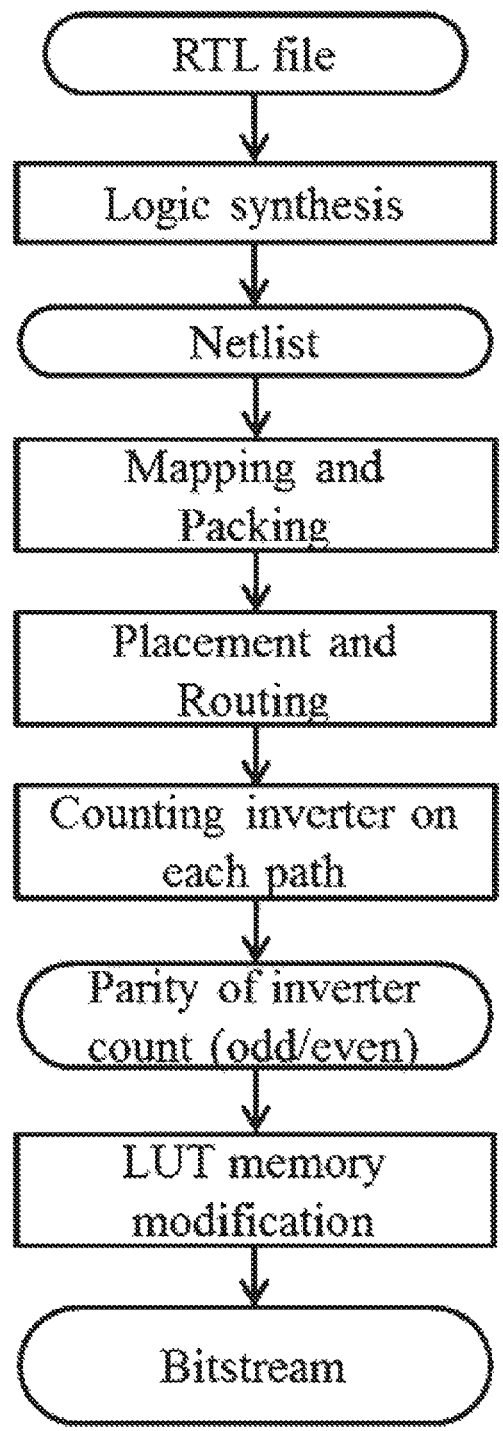
FIG. 7 shows flow chart for mapping file generation according to a second exemplary embodiment of the present invention.

FIG. 7 illustrates flow chart for mapping file generation to solve signal inverse problem in the long-distance routing circuit using inverters according to the present embodiment. In the first step, a register-transfer level (RTL) file of a target application circuit is acquired. Usually, two major hardware description languages (HDLs) including VHSIC hardware description language (VHDL) and Verilog are used to implement RTL abstraction. In the second step, a logic synthesis tool transforms RTL file into a netlist file including a set of Boolean gates, flip-flops and wiring connections. In the third step, a mapping tool transforms Boolean gates into LUTs to generate a network of LUTs and flip-flops. A packing tool clusters LUTs and flip-flops together into LBs. In the fourth step, a placement tool allocates position of LBs, and a routing tool determines data transfer paths between LBs. In the fifth step, inverter number on each data signal transfer path is counted and the inverter number parity information (odd/even) is obtained. In the sixth step, LUT memory values according to the inverter number parity information on each data signal transfer path is modified. Finally, configuration bitstream for switches in routing MUXs and memories in LUTs are obtained.

The reconfigurable circuits of the above exemplary embodiments may be used in, for example, mobile phone, IoT (Internet of Things) devices, and so on. A high-performance FPGA using the NVRSs can be realized by the reconfigurable circuits described above.

It is apparent that the present invention is not limited to the above exemplary embodiments and examples, but may be modified and changed without departing from the scope and sprit of the invention.

The invention claimed is:
1. A reconfigurable circuit comprising:
crossbar switches;
wires, each of which is coupled to one output port of one crossbar switch and input ports of the other crossbar switches;
at least one inverter inserted on each wire for driving long-distance signal transfer, wherein one or less first inverter is inserted on the wire between two adjacent crossbar switches;
one or two second inverters inserted between a crossbar switch input port and its connected wire,
a first lookup table that includes one output port connected to the at least one inverter;
a second lookup table that includes one output port connected to the at least one inverter; and
a third lookup table connected to the at least one inverter,
wherein the at least one inverter includes at least one inverter between the first lookup table and the third lookup table and at least one inverter between the second lookup table and the third lookup table, and
the third lookup table selects the output port of the first lookup table or the output port of the second lookup table based on a number of the at least one inverter between the first lookup table and the third lookup table and the number of the at least one inverter between the second lookup table and the third lookup table.

2. The reconfigurable circuit according to claim 1, further comprising a third inverter inserted between each crossbar switch output port and its connected wire.

3. The reconfigurable circuit according to claim 1, wherein two second inverters are inserted between a crossbar switch input port and its connected wire if first inverter number on the wire between the crossbar switch input port and the connected crossbar switch output port is odd.

4. The reconfigurable circuit according to claim 1, wherein the first and second lookup tables are used for function generation and a part of output ports of each crossbar switch are coupled to input ports of the first and second lookup tables.

5. The reconfigurable circuit according to claim 1, wherein the third lookup table is used for function generation and a part of input ports of each crossbar switch are coupled to output ports of the third lookup table.

6. The reconfigurable circuit according to claim 1, wherein each crossbar switch comprising:
    vertical wires whose terminals are used as input ports;
    horizontal wires whose terminals are used as output ports;
    switches coupling vertical wires and horizontal wires at each crosspoint.

7. The reconfigurable circuit according to claim 6, wherein
    the switch is non-volatile resistive switch comprising a metal oxide resistance change device or a solid electrolyte resistance change device.

8. A configuration method for reconfigurable circuit comprising crossbar switches; wires, each of which is coupled to one output port of one crossbar switch and input ports of the other crossbar switches; first inverters inserted on the wires between crossbar switches for driving long-distance signal transfer; second inverters inserted between a crossbar switch input port and its connected wire; a third inverter inserted between a crossbar switch output port and its connected wire; lookup tables whose output ports are coupled to a part of input ports of the crossbar switches and input ports are coupled to a part of output ports of the crossbar switches, the method comprising:
    counting inverter number between one lookup table input port and its connected output port of another lookup table.

9. The configuration method according to claim 8, further comprising:
    configuring a lookup table to implement a function of an inverse input signal in its input port if inverter number between the lookup table input port and its connected output port of another lookup table is odd.

10. The configuration method according to claim 8, further comprising:
    configuring memories of a lookup table to implement a function of an inverse input signal in its input port if inverter number between the lookup table input port and its connected output port of another lookup table is odd.

* * * * *